US006304167B1

(12) United States Patent
Nakayama

(10) Patent No.: US 6,304,167 B1
(45) Date of Patent: Oct. 16, 2001

(54) RESISTOR AND METHOD FOR MANUFACTURING THE SAME

(75) Inventor: Shogo Nakayama, Fukui (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/462,578

(22) PCT Filed: Jul. 7, 1998

(86) PCT No.: PCT/JP98/03051

§ 371 Date: Apr. 13, 2000

§ 102(e) Date: Apr. 13, 2000

(87) PCT Pub. No.: WO99/03112

PCT Pub. Date: Jan. 21, 1999

(30) Foreign Application Priority Data

Jul. 9, 1997 (JP) .................................................. 9-183369

(51) Int. Cl.[7] .................................................. H01L 10/00
(52) U.S. Cl. .......................... 338/195; 338/307; 338/309
(58) Field of Search .................................... 338/307, 308, 338/309, 195

(56) References Cited

U.S. PATENT DOCUMENTS

| | | | | |
|---|---|---|---|---|
| 3,699,650 | * | 10/1972 | Cocca .................................. | 338/308 |
| 4,626,822 | | 12/1986 | Melkeraaen . | |
| 4,630,025 | * | 12/1986 | Bourolleau .......................... | 338/309 |
| 5,081,439 | * | 1/1992 | Natzle et al. ........................ | 338/195 |
| 5,510,594 | * | 4/1996 | Mori et al. .......................... | 338/195 |
| 5,557,252 | * | 9/1996 | Ariyoshi .............................. | 338/195 |
| 5,754,092 | * | 5/1998 | Ishida et al. ......................... | 338/309 |
| 5,790,385 | * | 8/1998 | Tanimura ............................ | 338/308 |
| 5,898,563 | * | 4/1999 | Hanamura ........................... | 338/308 |
| 6,153,256 | * | 11/2000 | Kambara et al. .................... | 338/309 |

FOREIGN PATENT DOCUMENTS

| | | | | |
|---|---|---|---|---|
| 686 985 | | 8/1996 | (CH) . | |
| 07-066019 | | 3/1995 | (EP) . | |
| 08-213221 | | 8/1996 | (EP) . | |
| 63-170905 | | 7/1988 | (JP) . | |
| 01152701 | * | 6/1989 | (JP) ...................................... | 338/309 |
| 4-102302 | | 4/1992 | (JP) . | |
| 8-124701 | | 5/1996 | (JP) . | |

OTHER PUBLICATIONS

Japanese Search Report corresponding to application No. PCT/JP98/03051 dated Oct. 6, 1998.

English translation of Form PCT/ISA/210, (No date).

European Search Report, application No. 98929864.1, dated May 22, 2000.

* cited by examiner

*Primary Examiner*—Karl D. Easthom
(74) *Attorney, Agent, or Firm*—Ratner & Prestia

(57) ABSTRACT

A resistor for use in high density printed circuit board, having low current noise and improved resistance accuracy, and a method of manufacturing the resistor. A resistor of the present invention includes a substrate, a pair of upper-surface electrode layers formed on the end sections of the upper surface of said substrate, a resistor layer formed so that the layer is connected electrically to said upper-surface electrode layers, a first trimming groove formed by cutting said resistor layer, a resistance restoring layer which is formed to cover at least said first trimming groove, a second trimming groove formed by cutting the resistance layer and resistance restoring layer, and a protective layer provided to cover at least the resistance layer and second trimming groove. In this way, the resistors having a superior property in both the current noise characteristic and the resistance accuracy are obtained.

16 Claims, 10 Drawing Sheets

1.after resistor layer formation
2.after 1st trimming
3.after resistance restoring
4.after 2nd trimming
5.after protective layer formation
6.finished resistor 1.after resistor layer formation
2.after 1st trimming
3.after resistance restoring
4.after 2nd trimming
5.after protective layer formation
6.finished resistor

RESISTOR AND METHOD FOR MANUFACTURING THE SAME

THIS APPLICATION IS A U.S. NATIONAL PHASE APPLICATION OF PCT INTERNATIONAL APPLICATION PCT/JP98/03051.

TECHNICAL FIELD

The present invention relates to a resistor used for high-density wiring circuits, and a method of manufacturing the resistor.

BACKGROUND ART

One known resistor of the same category is disclosed in the Japanese Laid-open Patent publication No. H4-102302.

The conventional resistor and a method of manufacturing the resistor are described in the following with reference to drawings.

FIG. 8 is a sectional view of the conventional resistor.

In FIG. 8, first upper-surface electrode layers 2 are provided on the right and the left ends of the upper surface of the insulating substrate 1; a resistor layer 3 is provided partially overlapping on the first upper-surface electrode layers 2; a first protective layer 4 is provided to cover only the whole surface of the resistance layer 3; a trimming groove 5 for correcting the resistance is provided by cutting through the resistor layer 3 and the first protective layer 4; a second protective layer 6 is provided to cover only the upper surface of the first protective layer 4; second upper-surface electrode layers 7 are provided on the upper surface of the first upper-surface electrode layers 2 so as to spread until the end in the width of the insulating substrate 1; side electrode layers 8 are provided on the side surfaces of the insulating substrate 1; nickel plated layers 9 and solder plated layers 10 are provided on the surfaces of the second upper-surface electrode layers 7 and the side electrode layers 8.

A method of manufacturing the resistor as configured above is described next, referring to drawings.

FIG. 9 illustrates process steps of manufacturing the conventional resistor.

In the first place, as shown in FIG. 9(*a*), first upper-surface electrode layers 2 are formed on the right and the left ends of upper surface of the insulating substrate 1, using a printing process.

Then, as shown in FIG. 9(*b*), a resistor layer 3 is formed by a printing process on the upper surface of the insulating substrate 1 so that part of the resistor layer overlaps on the first upper-surface electrode layers 2.

As shown in FIG. 9(*c*), a first protective layer 4 is formed by a printing process covering only the whole surface of the resistor layer 3, and then a trimming groove 5 is formed by cutting through the resistor layer 3 and the first protective layer 4 using a laser, or other means, in order to adjust the overall resistance of the resistance layer 3 to be falling within a certain predetermined range.

A second protective layer 6 is formed by a printing process covering only the upper surface of the first protective layer 4, as shown in FIG. 9(*d*).

As shown in FIG. 9(*e*), a second upper-surface electrode layer 7 is formed on the upper surface of the first upper-surface electrode layer 2 by a printing process so that the electrode layer stretches to the ends of the insulating substrate 1.

As shown in FIG. 9(*f*), a side electrode layer 8 is formed by a coating process covering the right and the left side end surfaces of the first upper-surface electrode layer 2 and the insulating substrate 1, electrically coupling with the first and the second upper-surface electrode layers 2 and 7.

Finally, surfaces of the second upper-surface electrode layer 7 and the side electrode layer 8 are plated with nickel, and then with solder, for forming a nickel plated layer 9 and a solder plated layer 10. The conventional resistors are manufactured through the above described process steps.

However, with the conventional resistors having the above described configuration and manufactured through the conventional procedure, where a trimming groove 5 has been formed by cutting the resistance layer 3 and the first protective layer 4 with a laser or other means to improve the resistance accuracy, a current noise is generated in the resistor.

Now, the mechanism of current noise generation is described in the following with reference to drawings.

FIG. 10(*a*) shows a relationship between the resistance correction ratio and the current noise, exhibited by a 1005 size, 10 kΩ resistor having the conventional configuration, manufactured through the conventional process. The graph indicates that the current noise characteristic gets worse along with an increasing ratio of the resistance correction. Basically, an increased ratio of the resistance correction results in a reduction in the effective resistance area of the resistor layer, which eventually leads to a ski deteriorated current noise characteristic. In reality, however, extent of the deterioration in the current noise characteristic is more than what the basic principle explains. The resistor layer is damaged by the heat generated during the resistance correction in the area around the trimming groove, and by the micro cracks caused thereby. The wide dispersion of the current noise started after the resistance correction, as shown in FIG. 10(*a*), represents a dispersion existing in the extent of deterioration of the resistance layer.

FIGS. 10(*b*), (*c*) show shift of the current noise generated in the resistor layer measured after the respective process steps;

FIG. 10(*b*) represents a resistor whose second protective layer is formed of a resin, FIG. 10(*c*) represents a resistor whose second protective layer is formed of a glass. The deterioration of current noise characteristic stems from the trimming process, as described earlier. In a resistor having second resin protective layer, the deteriorated current noise characteristic remains as it is until the stage of finished resistor.

Whereas, in a resistor having second glass protective layer, although a sufficient amount of heat that is required for restoring the resistance is provided at the baking process for the second protective layer the deteriorated resistor layer is hardly repaired, because the resistor layer has been covered by the first protective layer which was already baked and the glass component can not permeate into micro cracks of the resistor layer generated during the trimming operation. Namely, the current noise is hardly restored.

The current noise may be restored if the baking temperature is raised to a level at which the glass component contained in the resistor layer softens to repair the micro cracks. In this case, however, a resistance accuracy achieved by the trimming operation can not stay as it is until the stage of finished resistor.

As described in the foregoing, a problem with the conventional resistors configured above and manufactured by a conventional method to provide a certain predetermined resistance is the increased current noise due to the heat and micro cracks generated at the vicinity of the trimming groove during the resistance correcting operation.

The present invention addresses the above problem and aims to provide a resistor, as well as the method of manufacturing, that is superior in both the current noise characteristic and the resistance accuracy.

DISCLOSURE OF THE INVENTION

A resistor of the present invention includes a substrate, a pair of upper-surface electrode layers formed on the side sections of the upper surface of said substrate, a resistor layer formed so that the layer is connected electrically to said upper-surface electrode layers, a first trimming groove formed by cutting said resistor layer, a resistance restoring layer which is formed to cover at least said first trimming groove, a second trimming groove formed by cutting said resistance layer and resistance restoring layer, and a protective layer provided to cover at least said resistance layer and second trimming groove.

In a resistor of the above configuration, since the resistance restoring layer has been disposed covering the first trimming groove which was formed by cutting the resistance layer, glass component contained in the resistance restoring layer softened and melted during the baking operation for forming the resistance restoring layer permeates into micro cracks generated at the first trimming operation. This rehabilitates the deteriorated resistor layer; as the result, the current noise decreases significantly after, formation of the resistance restoring layer, as compared with that after the first trimming operation. Furthermore, dispersion of the resistance, which was somewhat ill-affected when the resistance restoring layer was provided, can be improved precisely to a specified value by a fine-adjusting operation conducted at the formation of the second trimming groove by cutting the resistance layer and resistance restoring layer. Thus the resistance can be corrected precisely while a superior current noise characteristic is maintained up until the state of finished resistor. In this way, the resistors having a superior property in both the current noise characteristic and the resistance accuracy are obtained in accordance with the present invention.

BEST MODE FOR CARRYING OUT THE INVENTION

Embodiment 1

A resistor in a first exemplary embodiment of the present invention and a method for manufacturing the resistor are described with reference to the drawings.

Figure 1A:
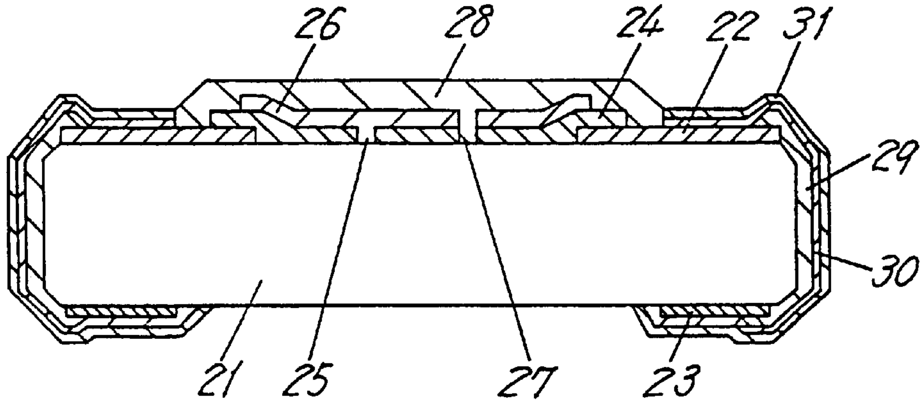
FIG. 1(*a*) is a sectional view of a resistor in a first embodiment of the present invention, FIG. 1(*b*) is a see-through view of the resistor viewed from the above.
Figure 1B:
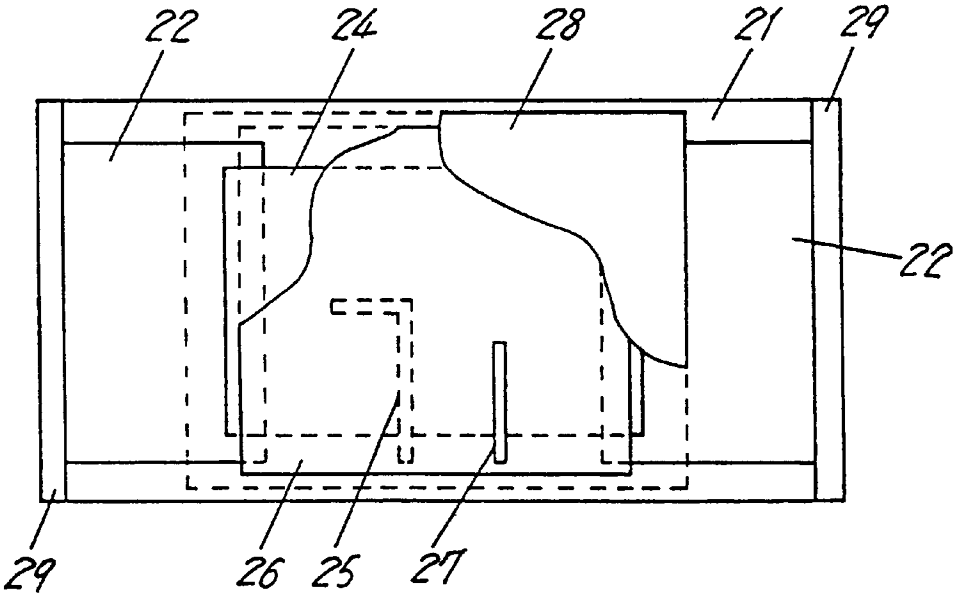
Figure 2A:
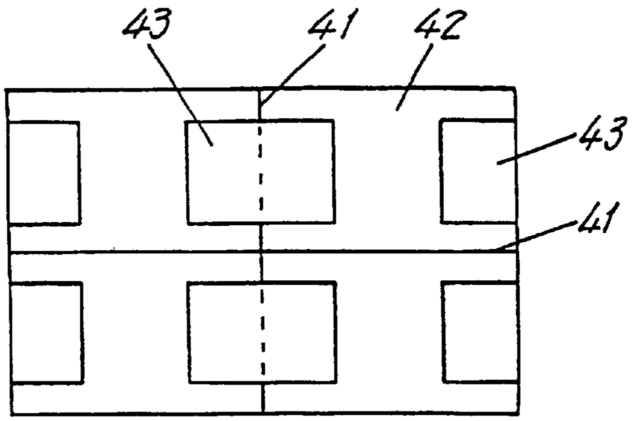
FIGS. 2(*a*)–(*d*) illustrate a process for manufacturing the resistor.
Figure 2B:
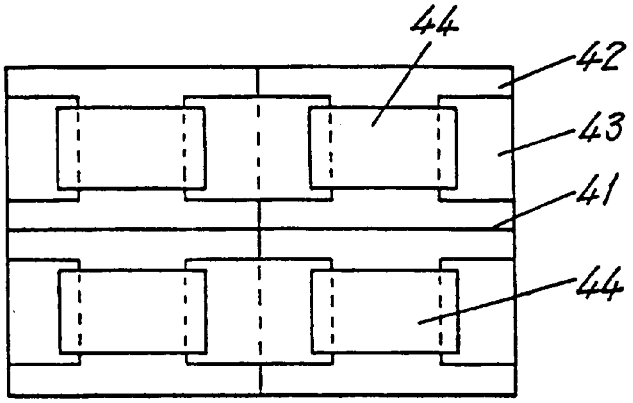
Figure 2C:
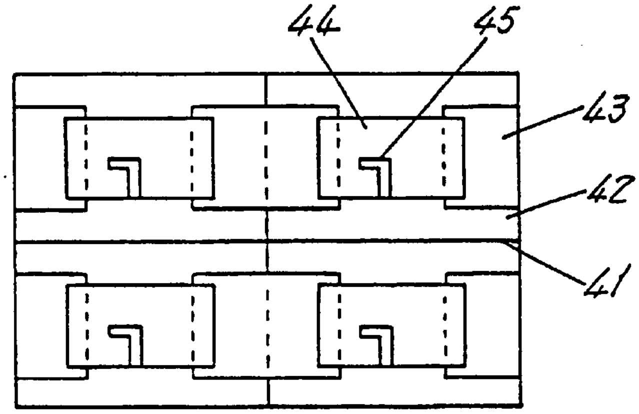
Figure 2D:
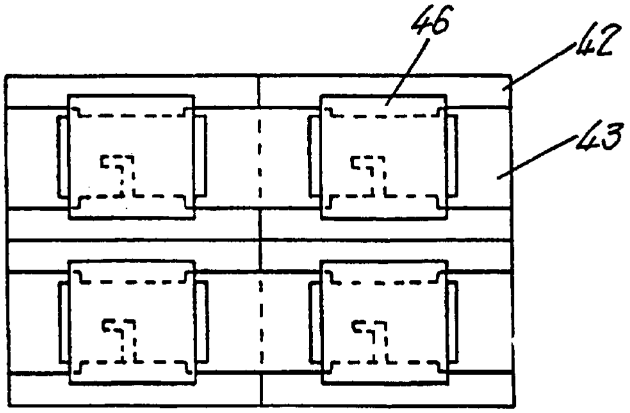
Figure 3A:
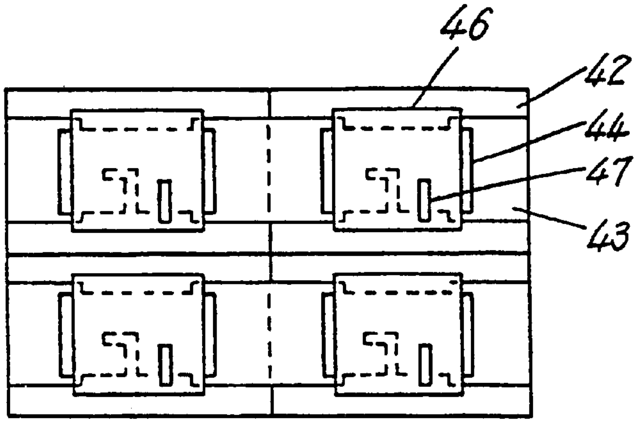
FIGS. 3(*a*)–(*e*) illustrate a process for manufacturing the resistor.
Figure 3B:
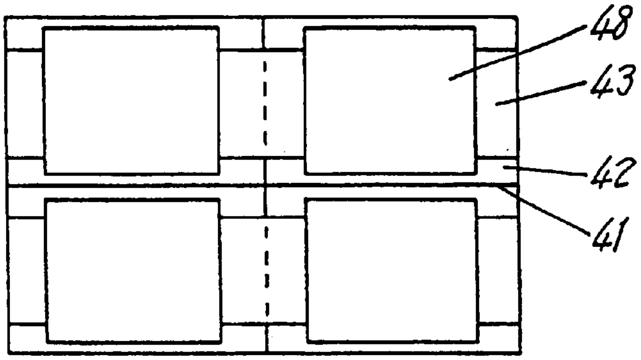
Figure 3C:
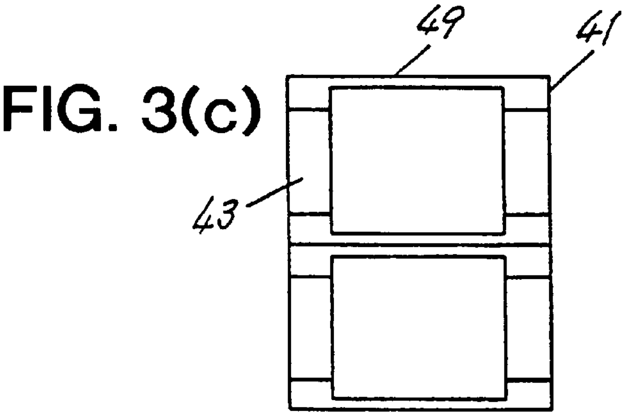
Figure 3D:
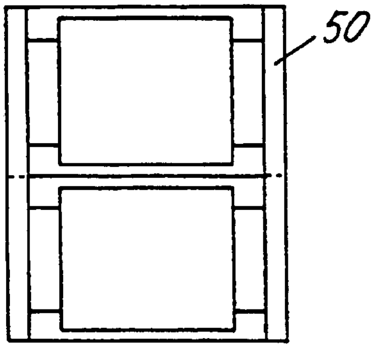
Figure 3E:
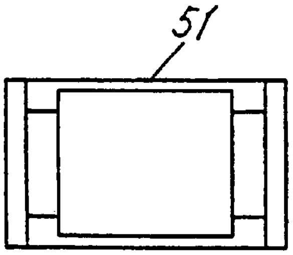

FIG. 1(*a*) is a sectional view of a resistor in embodiment 1 of the present invention, FIG. 1(*b*) is a see-through view of the resistor as seen from the above.

In FIG. 1, numeral 21 denotes a substrate made of alumina or the like material ; a pair of upper-surface electrode layers 22 is made of a mixture of silver and glass, or the like material, and is formed on the end sections of the upper surface of the substrate 21; a pair of bottom-surface electrode layers 23 is made of a mixture of silver and glass, or the like material, and is formed, depending on needs, on the end sections of the bottom surface of the substrate 21; a resistor layer 24 is made of a mixture of ruthenium oxide and glass, a mixture of silver, palladium and glass, or the like material, and is formed on the upper surface of the substrate 21 so that the resistor layer partly overlaps on the upper-surface electrode layers 22 making electrical contact; a first trimming groove 25 is formed by cutting the resistor layer 24 with a laser, or other means, for correcting the resistance to a certain predetermined value; a resistance restoring layer 26 is made of a borosilicate lead glass, having a softening point of 500° C.–600° C., or the like material, and is formed to cover at least the resistor layer 24; a second trimming groove 27 is formed by cutting the resistance layer 24 with a laser, or the like means, for fine-adjusting the resistance to a certain predetermined value; a protective layer 28 is made of a borosilicate lead glass, an epoxy resin, or the like material, and is formed to cover at least the resistor layer 24; a side electrode layer 29 is made of a mixture of silver and glass, or the like material, and is formed, depending on needs, on the side surface of the substrate 21 electrically connecting the upper-surface electrode layer 22 and the bottom-surface electrode layer 23; a first plated layer 30 is made of nickel, or the like material, and is formed, depending on needs, to cover the side electrode layer 29 and the exposed portions of the upper-surface electrode layer 22 and the bottom-surface electrode layer 23; a second plated layer 31 is formed, depending on needs, to cover the first plated layer 30.

Next, a method for manufacturing the above-configured resistor is described referring to the drawings.

FIG. 2 and FIG. 3 illustrate a process for manufacturing a resistor in a first exemplary embodiment of the present invention.

As shown in FIG. 2(*a*), upper-surface electrode layers 43 are formed on a sheet 42 which is made of alumina, or the like material, having lateral and longitudinal dividing slits 41, with paste of a mixture of silver and glass by screen-printing across the dividing slit 41, drying and then baking in a continuous belt furnace under a temperature profile of about 850° C. for about 45 minutes. Depending on needs, bottom-surface electrode layers (not shown) may be formed at the same time on the bottom surface of the sheet 42 at places opposing to the upper-surface electrode layers 43 by screen-printing and drying paste of a mixture of silver and glass.

Then, as shown in FIG. 2(*b*), a resistor layer 44 is formed bridging the upper-surface electrode layers 43, with paste of a mixture of ruthenium oxide and glass by screen-printing on the upper surface of the sheet 42 so that it partly overlaps on the upper-surface electrode layers 43, drying and then baking in a continuous belt furnace under a temperature profile of about 850° C. for about 45 minutes.

As shown in FIG. 2(*c*), a first trimming groove 45 is formed by a laser, or the like means, in order to correct resistance of the resistor layer 44 to an 85% of the resistance of a final resistance, taking into consideration the possible resistance shifts during process steps it undergoes before making a finished resistor.

Then, a resistance restoring layer 46 is formed, as shown in FIG. 2(*d*), covering the upper surface of the resistor layer 44, with paste of a borosilicate lead glass by screen-printing, drying and then baking in a continuous belt furnace under a temperature profile of about 620° C. for about 45 minutes.

In order to fine-adjust the resistance of resistor layer 44, a second trimming groove 47 is formed by a laser, or the like means, as shown in FIG. 3(*a*).

As shown in FIG. 3(*b*), a protective layer 48 is formed covering at least the upper surface of the resistor layer 44 (not shown in the present illustration), with paste of a borosilicate lead glass by screen-printing, drying and then baking in a continuous belt furnace under a temperature profile of about 620° C. for about 45 minutes.

The sheet 42 is divided along a dividing slit 41 so that the upper-surface electrode layer 43 is exposed at the side of the substrate, as shown in FIG. 3(*c*); and a substrate 49 of a strip-shape is provided.

Depending on needs, a side electrode layer 50 is formed, as shown in. FIG. 3(*c*), on the side surface of the strip-shape substrate 49 partly overlapping on the upper-surface electrode layers 43, with paste of a mixture of silver and glass transfer-printed by a roller, dried and then baked in a continuous belt furnace under a temperature profile of about 620° C. for about 45 minutes.

The substrate 49 of a strip-shape is divided into pieces 51, as shown in FIG. 3(*e*).

Finally, depending on needs, a first plated layer (not shown) is formed with nickel, or the like material, covering the side electrode layer 50 and the exposed portions of the upper-surface electrode layer 43 and the bottom-surface electrode layer, and a second plated layer (not shown) is formed with a tin lead alloy, or the like material, covering the first plated layer. A resistor in exemplary embodiment 1 of the present invention is thus manufactured.

Although a mixed material of silver and glass has been used for forming the protective layer in a resistor of embodiment 1 of the present invention, an epoxy resin, a phenolic resin or the like material may be used instead for the same purpose.

Although a mixed material of silver and glass has been used for the side electrode layer 50 in a resistor of embodiment 1 of the present invention, a nickel containing phenolic resin or the like material may be used instead for the same purpose.

Now in the following, operation and function of the above described resistor are described referring to the drawings.

Figure 4A:
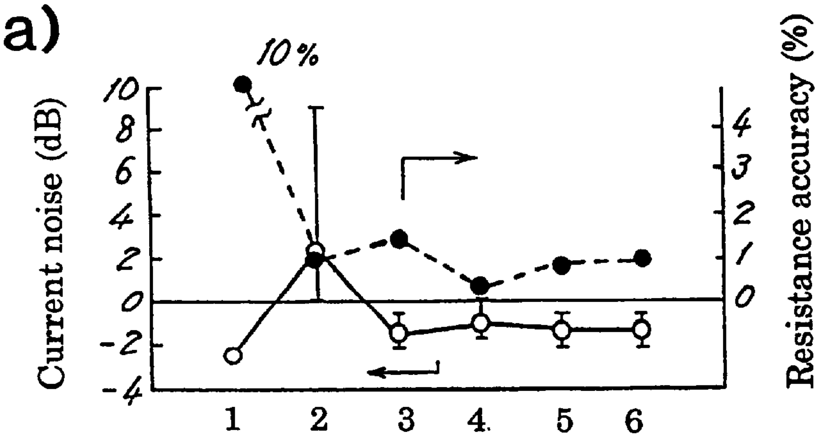
FIGS. 4(*a*) and (*b*) show a relationship between the current noise and the resistance accuracy in the resistor layer, after respective process steps in the manufacturing method.
Figure 4B:
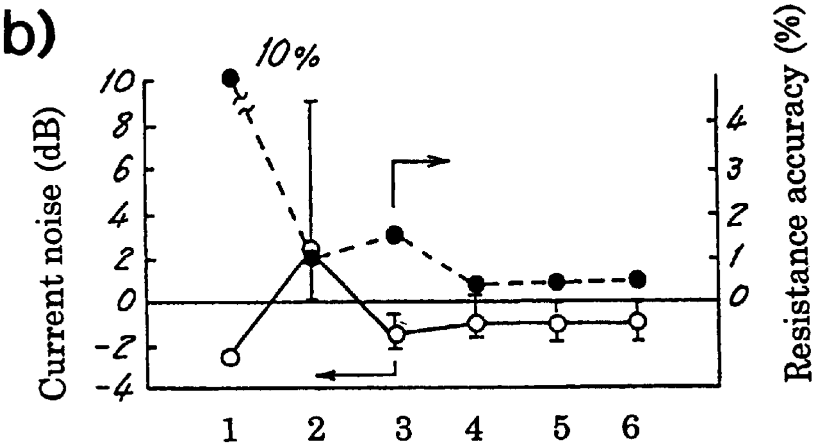

FIG. 4 shows a relationship, after respective process steps, between the current noise and the resistance accuracy in a resistor layer in embodiment 1 of the present invention. FIG. 4(*a*) exhibits the resistors of embodiment 1 whose protective layer, which being a key portion, is formed of a glass, while FIG. 4(*b*) represents the resistors whose protective layer is formed of a resin.

It is seen that the current noise significantly decreases after formation of the resistance restoring layer, as compared with that after the first trimming process. The reason can be explained that the glass component contained in the resistance restoring layer that softened and melted during baking for the formation of resistance restoring layer has permeated into micro cracks generated at the first trimming operation, to repair the deteriorated resistor layer.

Furthermore, the second trimming is for fine-adjusting the resistance of a resistor to a higher accuracy with an aim to narrow the dispersion in resistance among the resistors, which dispersion could have somewhat deteriorated as a result of formation of the resistance restoring layer.

Therefore, if the resistance was already corrected at the first trimming process to be closer to a targeted value for more than 80%, ratio of the resistance correction needed at the second trimming may be not higher than 1.3 times relative to a resistance before the second trimming. Then, a deterioration of the current noise characteristic to be caused by the second trimming will stay only nominal.

In a case where the ratio of resistance correction at the second trimming is higher than 1.3 times, the current noise characteristic shows a considerable deterioration, though, not so remarkable as in the conventional resistors.

Taking advantage of the above functions, the resistors in accordance with exemplary embodiment 1 of the present invention can undergo the resistance correction processes while preserving a state of the superior current noise characteristic up until the stage of finished resistor. Thus the resistors superior in the current noise characteristic are obtained.

Regarding the resistance accuracy after the firing of the protective layer, the dispersion of the resistance goes slightly greater than that of after the second trimming among those resistors whose protective layer is formed of a glass. Conventional resistors also exhibit more or less the same trends. However, comparing with the conventional resistors, the dispersion is smaller among the resistors in embodiment 1 of the present invention, in which the lower degree of deterioration existed in the resistance layer before formation of the protective layer. This contributes to implement a resistor that is superior also in the resistance-value accuracy.

Further, among the resistors whose protective layer is formed of a resin, hardly any resistance shift occurs at the formation of the protective layer, and thereafter. Therefore, the accuracy of resistance provided at the stage of the second trimming can be maintained as it is, and it makes itself an resistance accuracy of a finished resistor. Thus the resistors whose protective layer is formed of a resin exhibit a superior resistance accuracy, as compared with those resistors whose protective layer is formed of a glass.

The accuracy of second trimming bears decisive factor to the resistance accuracy of a finished resistor. Whereas, the first trimming is not required to be so accurate as the second trimming. Therefore, for the purpose of obtaining a higher productivity, the bite size, which corresponds to the resistance layer cutting length per one laser pulse, may be made larger in the first trimming than in the second trimming.

The resistors that are provided with superior properties in both the current noise characteristic and the resistance accuracy are thus obtained by taking advantage of the above described reasons.

Depending on needs, by providing the bottom-surface electrode layer and the side electrode layer, a resistor in embodiment 1 of the present invention can be mounted regardless of facing(up or down) of the resistor to a printed circuit board in a stable manner.

Next in the following, the current noise and the resistance accuracy are compared between the resistors in embodiment 1 of the present invention and conventional resistors.

Method of Experiment

Resistors of 1005 size, 10 kΩ finished resistance, were measured and compared with respect to the current noise and the dispersion of resistance value; among those of conventional configuration, those in embodiment 1 of the present invention having glass protective layer and those having resin protective layer. The current noise was measured with an Quan-tech equipment, model 1315c.

Experimental Results

Table 1 compares measured current noise and dispersion of trimming accuracy between the conventional resistors and those in embodiment 1 of the present invention.

TABLE 1

| | | Resistors in the embodiment 1 | |
|---|---|---|---|
| | Conventional resistors | Glass protective layer | Resin protective layer |
| Current noise (dB) | 1.8–10.5 | −2.1—0.5 | −1.9–0.0 |
| Resistance accuracy (%) | 1.22 | 0.98 | 0.43 |

Resistance accuracy = 3 × standard deviation/average resistance × 100 (%)

As seen from Table 1, the resistors in embodiment 1 of the present invention are provided with smaller figures both in the current noise and the resistance accuracy, compared with the conventional resistors.

Embodiment 2

A resistor in a second exemplary embodiment of the present invention and a method for manufacturing the resistor are described with reference to the drawings.

Figure 5A:
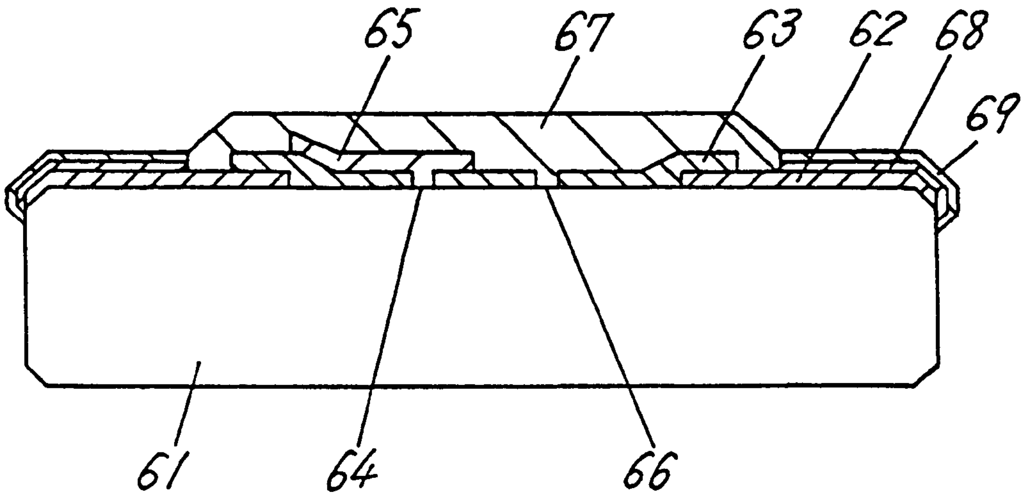
FIG. 5(*a*) is a sectional view of a resistor in a second embodiment of the present invention, FIG. 5(*b*) is a see-through view of the resistor viewed from the above.
Figure 5B:
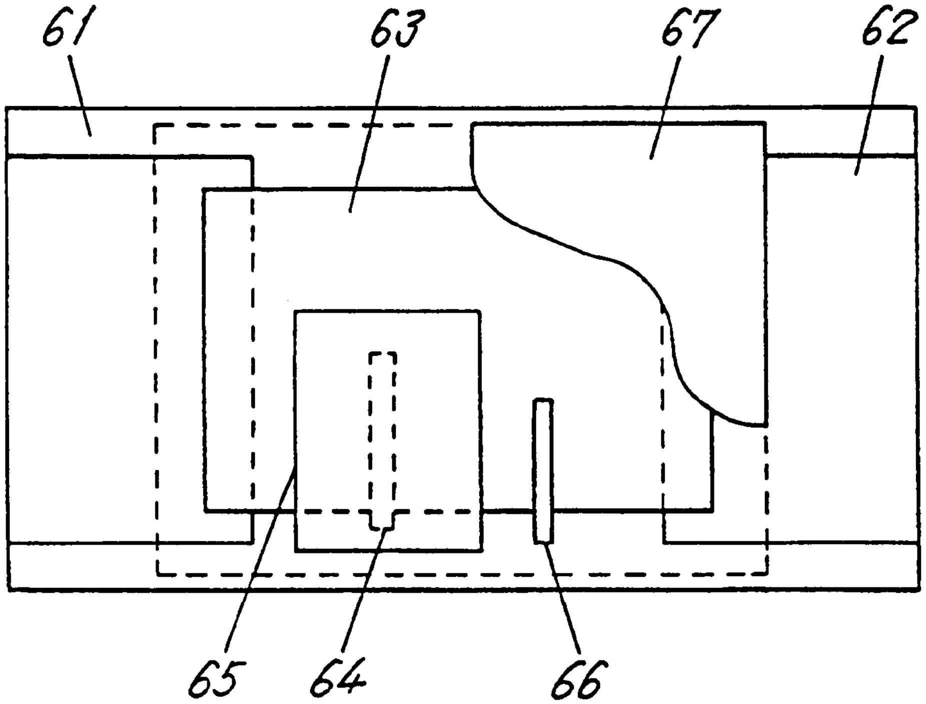
Figure 6A:
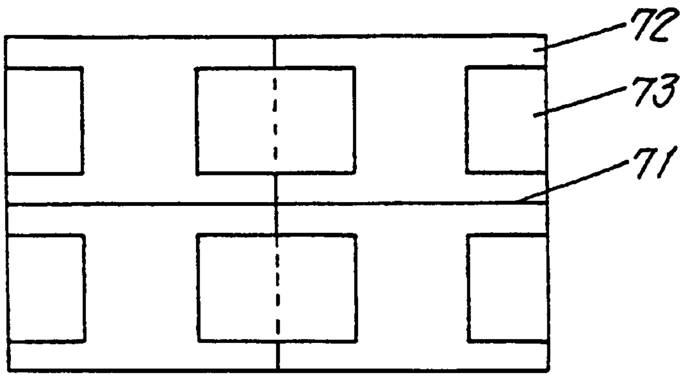
FIGS. 6(*a*)–(*d*) illustrate a process for manufacturing the resistor.
Figure 6B:
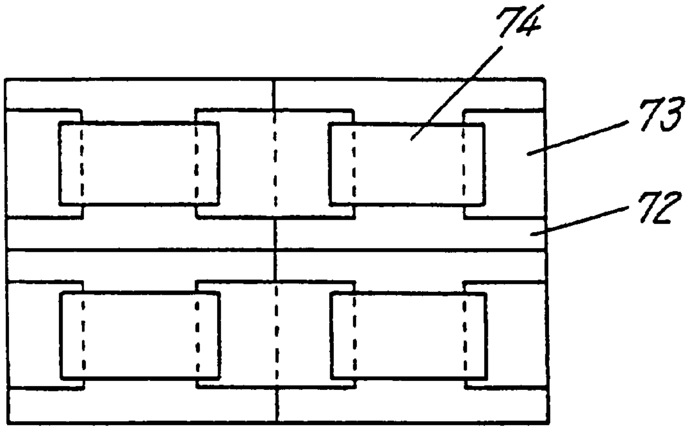
Figure 6C:
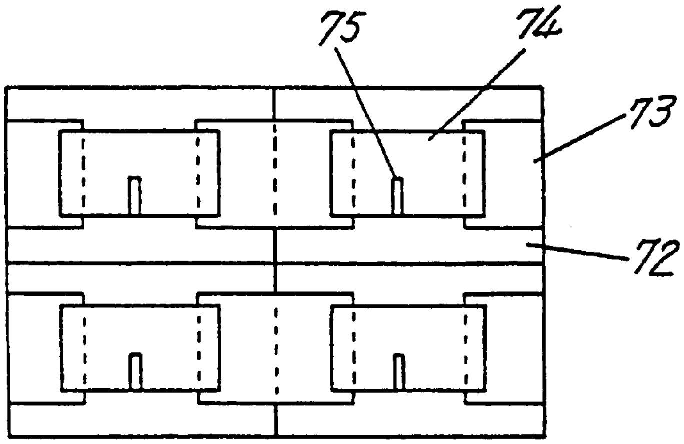
Figure 6D:
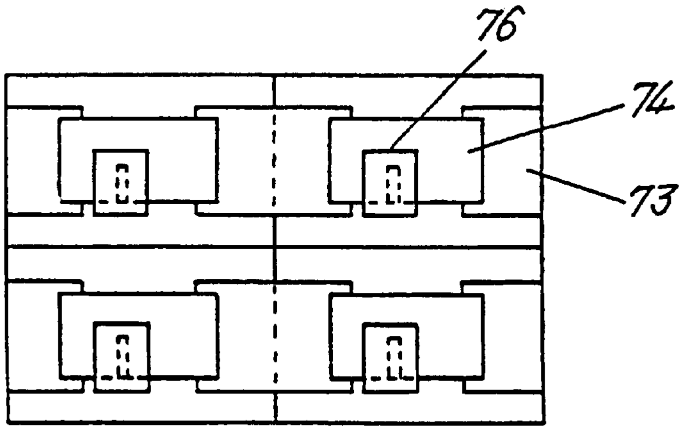
Figure 7A:
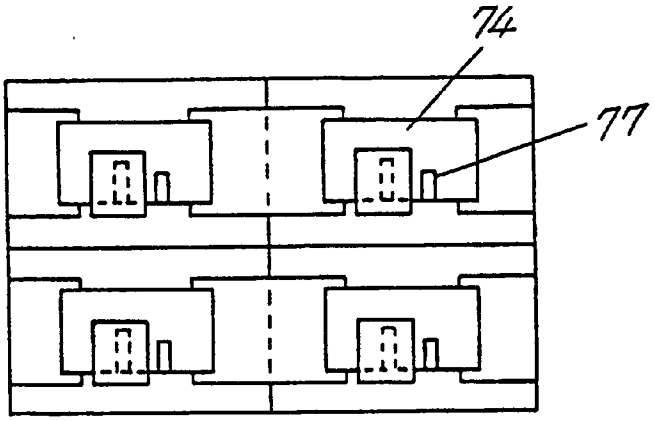
FIGS. 7(*a*)–(*d*) illustrate a process for manufacturing the resistor.
Figure 7B:
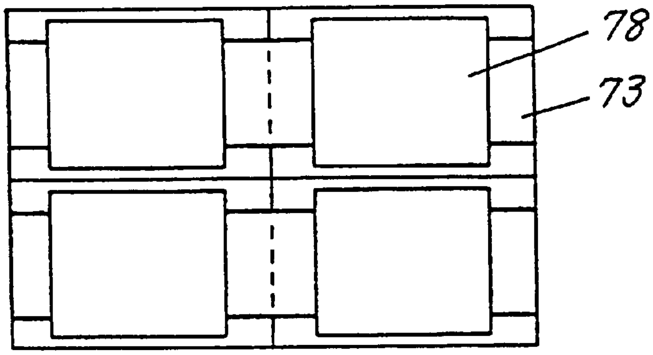
Figure 7C:
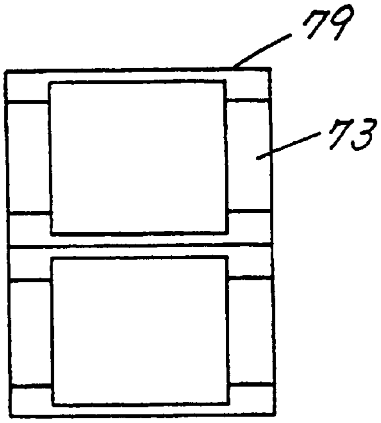
Figure 7D:
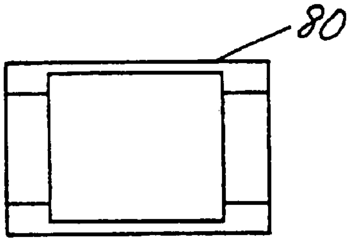
Figure 8:
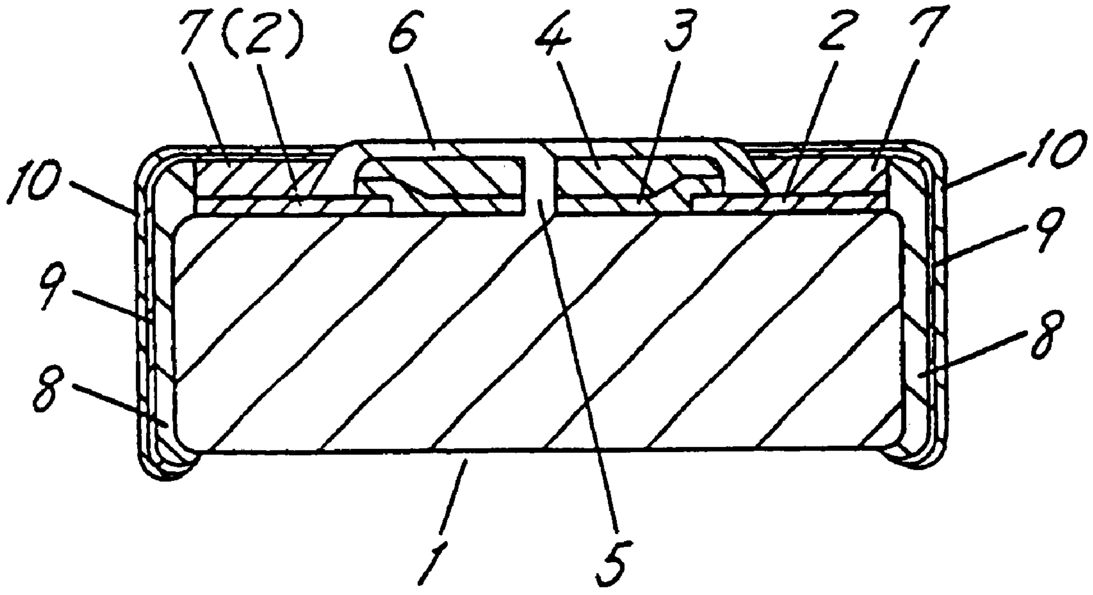
FIG. 8 is a sectional view of a conventional resistor.
Figure 9A:
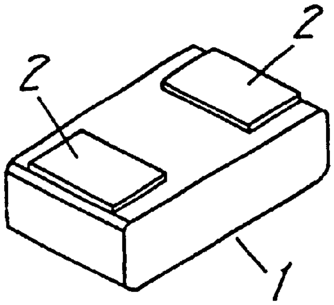
FIGS. 9(*a*)–(*f*) illustrate a process for manufacturing the conventional resistor.
Figure 9B:
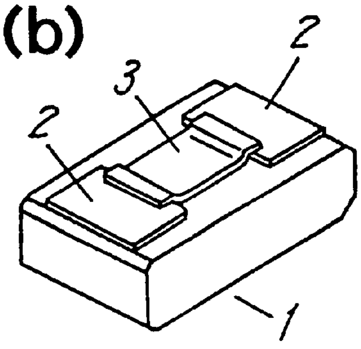
Figure 9C:
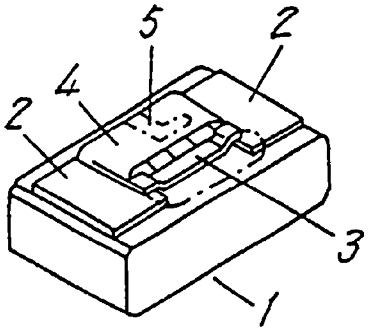
Figure 9D:
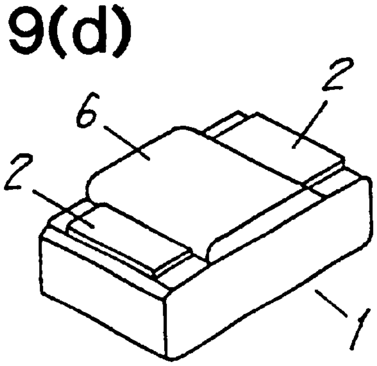
Figure 9E:
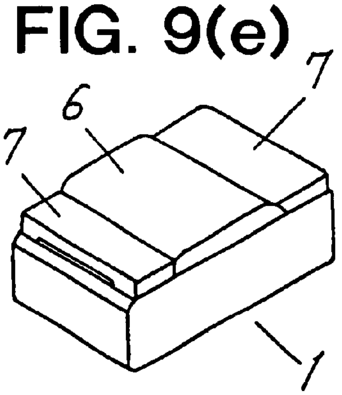
Figure 9F:
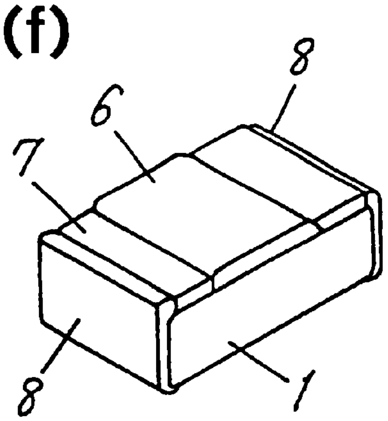
Figure 10A:
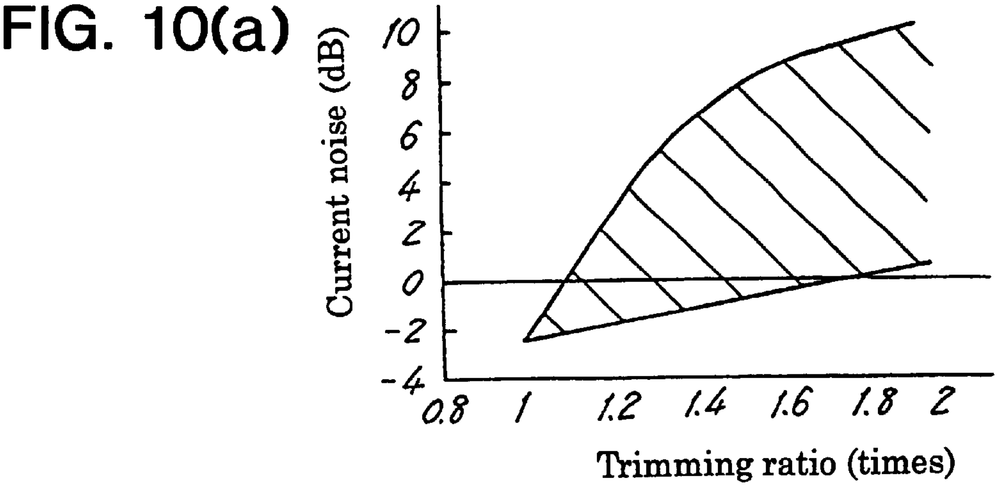
FIGS. 10(*a*)–(*c*) show a relationship between the ratio of trimming for resistance correction and the current noise in the conventional resistor.
Figure 10B:
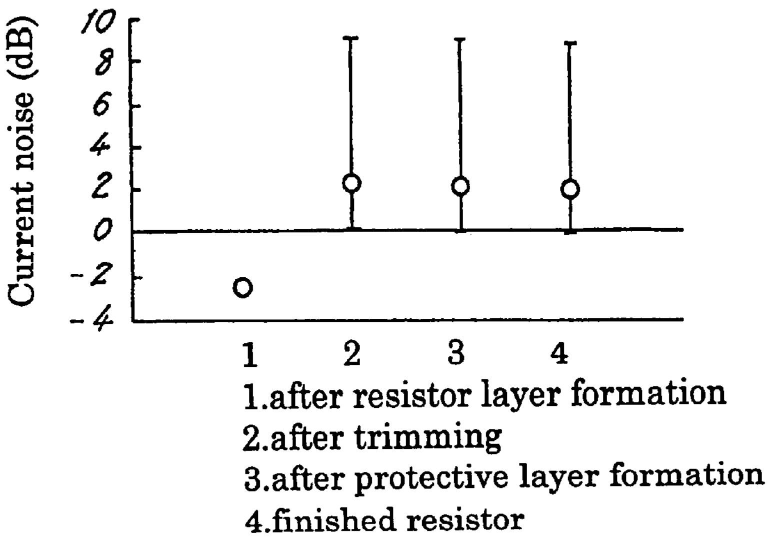
Figure 10C:
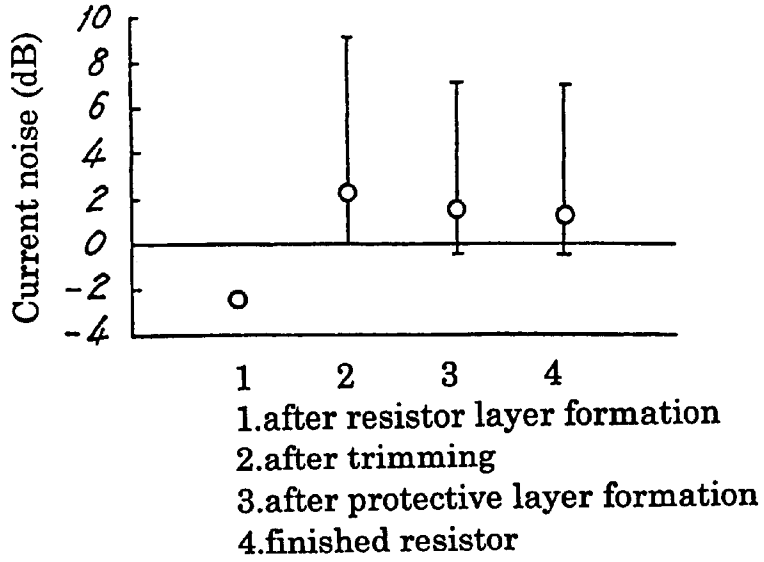

FIG. 5(*a*) is a sectional view of a resistor in embodiment 2 of the present invention, FIG. 5(*b*) is a see-through view of the resistor as seen from the above.

In FIG. 5, numeral 61 denotes a substrate made of alumina or the like material; a pair of upper-surface electrode layers 62 is made of a mixture of silver and glass, or the like material, formed on the side ends of the upper surface of the substrate 61; a resistor layer 63 is made of a mixture of ruthenium oxide and glass, a mixture of silver, palladium and glass, or the like material formed on the upper surface of the substrate 61 so that the continuous resistor layer partly overlaps on the upper-surface electrode layers 62 making direct electrical contact; a first trimming groove 64 is formed by cutting the resistor layer 63 with a laser, or other means, for correcting the resistance to a certain predetermined value; a resistance restoring layer 65 is made of a borosilicate lead glass, having a softening point of 500° C.–600° C., or the like material, formed to cover at least the resistance layer 63; a second trimming groove 66 is formed by cutting the resistor layer 63 with a laser, or the like means, for fine-adjusting the resistance to a certain predetermined value; a protective layer 67 is made of a borosilicate lead glass, an epoxy resin, or the like material, formed to cover at least the resistor layer 63; a first plated layer 68 is made of nickel, or the like material, formed, depending on needs, to cover the exposed portion of the upper-surface electrode layer 62; a second plated layer 69 is formed, depending on needs, to cover the first plated layer 68.

Next, a method for manufacturing the above-configured resistor is described referring to the drawings.

FIG. 6 and FIG. 7 illustrate a process for manufacturing a resistor in a second exemplary embodiment of the present invention.

As shown in FIG. 6(*a*), upper-surface electrode layers 73 are screen-printed on a sheet 72 made of alumina, or the like material, having lateral and longitudinal dividing slits 71, with paste of a mixture of silver and glass across the dividing slit 71, dried and then baked in a continuous belt furnace under a temperature profile of about 850° C. for about 45 minutes.

Then, as shown in FIG. 7(*b*), a resistor layer 74 is screen-printed electrically bridging the upper-surface electrode layers 73, with paste of a mixture of ruthenium oxide and glass on the upper surface of the sheet 72 so that it partly overlaps on the upper-surface electrode layers 73, dried and then baked in a continuous belt furnace under a temperature profile of about 850° C. for about 45 minutes.

As shown in FIG. 6(*c*), a first trimming groove 75 is formed by a laser, or the like means, in order to correct resistance of the resistor layer 74.

Then, a resistance restoring layer 76 is screen-printed, as shown in FIG. 6(*d*), covering the upper surface of the resistance layer 74, with paste of a borosilicate lead glass, dried and then baked in a continuous belt furnace under a temperature profile of about 620° C. for about 45 minutes.

In order to fine-adjust the resistance of resistor layer 74, a second trimming groove 77 is formed by a laser, or the like means, as shown in FIG. 7(*a*).

As shown in FIG. 7(*b*), a protective layer 78 is screen-printed covering the upper surface of the resistor layer 74 (not shown in the present illustration), with paste of a borosilicate lead glass, dried and then baked in a continuous belt furnace under a temperature profile of about 620° C. for about 45 minutes.

The sheet 72 is divided along a dividing slit 71 so that the upper-surface electrode layer 73 is exposed at the side of the substrate, as shown in FIG. 7(*c*); and a substrate 79 of a strip-shape is provided.

The substrate 79 of a strip-shape is divided into pieces 80, as shown in FIG. 7(*d*).

Finally, depending on needs, a first plated layer (not shown) is formed with nickel, or the like material, covering the exposed portion of the upper-surface electrode layer 73, and a second plated layer (not shown) is formed with a tin lead alloy, or the like material, covering the first plated layer.

Although a mixed material of silver and glass has been used for the protective layer in a resistor of exemplary embodiment 2 of the present invention, an epoxy resin, a phenol resin, or the like material may be used instead for the same purpose.

Operational principles and functions with the above configured resistors manufactured through the above manufacturing process remain the same as those in embodiment 1 of the present invention. So, description on which is omitted here. In the following, the resistors in embodiment 2 of the present invention and conventional resistors are compared with respect to the current noise and the resistance accuracy.

(Method of Experiment)

Resistors of 1005 size, 10 kΩ finished resistance, were measured and compared with respect to the current noise and the dispersion of resistance, between those of conventional configuration and those in embodiment 2 of the present invention having resin protective layer. The current noise was measured with an Quan-tech equipment, model 1315c.

Experimental Results

Table 2 compares measured current noise and dispersion of trimming accuracy, between the conventional resistors and those in embodiment 2 of the present invention.

TABLE 2

| | Conventional resistors | Resistors in the embodiment 1 resin protective layer |
|---|---|---|
| Current noise (dB) | 1.8–10.5 | −2.1—0.1 |
| Resistance accuracy (%) | 1.22 | 0.46 |

Resistance accuracy = 3 × standard deviation/average resistance × 100 (%)

As seen from Table 2, the resistors in embodiment 2 of the present invention exhibit smaller figures in both the current noise and the resistance accuracy, compared with the conventional resistors.

INDUSTRIAL APPLICABILITY

A resistor of the present invention includes a substrate, a pair of upper-surface electrode layers formed on the end sections of the upper surface of said substrate, a resistor layer formed so that the layer is connected electrically to said upper-surface electrode layers, a first trimming groove formed by cutting said resistance layer, a resistance restoring layer which is formed to cover at least said first trimming groove, a second trimming groove formed by cutting said resistor layer and resistance restoring layer, and a protective layer provided to cover at least said resistor layer and second trimming groove.

In a resistor of the above configuration, since the resistance restoring layer has been disposed covering the first trimming groove provided by cutting the resistance layer, the glass component contained in the resistance restoring layer softened and melted during the baking operation for forming the resistance restoring layer permeates into micro cracks generated at the first trimming operation. This repairs the deteriorated resistor layer; as a result, the current noise after formation of the resistance restoring layer shows a significant decrease as compared with that after the first trimming operation.

Furthermore, dispersion of the resistance, which was somewhat ill-affected by the formation of said resistance restoring layer, is improved as a result of a fine-adjusting operation in which the second trimming groove is provided by cutting said resistance layer and resistance restoring layer in order to bring the resistance to a specified value.

Thus, the resistance can be corrected precisely with a resistor of the present invention having the above described configuration, while a superior current noise characteristic is maintained excellent until a finished resistor.

In this way, resistors that are superior both in the current noise characteristic and in the resistance accuracy can be obtained in accordance with the present invention.

What is claimed is:

1. A resistor comprising:

a substrate, a pair of upper-surface electrode layers formed on the end sections of the upper surface of said substrate, a continuous resistor layer formed so that it is connected directly to said upper-surface electrode layers, a first trimming groove formed by cutting said resistance layer, a resistance restoring layer formed to cover at least said first trimming groove, a second trimming groove formed by cutting said resistance layer away from said resistance restoring layer, and a protective layer provided to cover at least said resistance layer and second trimming groove.

2. The resistor of claim 1, further comprising:

a pair of bottom-surface electrode layers formed on the end sections of the bottom surface of the substrate, and side electrode layers formed on the side surfaces of the substrate electrically connecting the upper-surface electrode layer and said bottom-surface electrode layers.

3. The resistor of claim 2, wherein the length of the first trimming groove is set for a length needed to attain a resistance of not less than 80% of a targeted resistance.

4. The resistor of claim 2, wherein the length the second trimming groove is set for a length by which the ratio of resistance correction after the second trimming is not higher than 1.3 times relative to the resistance before the second trimming.

5. The resistor of claim 2, wherein the resistance restoring layer is formed of a borosilicate lead glass having a softening point of 500° C.–600° C.

6. The resistor of claim 2, wherein the protective layer is formed of an epoxy resin or a phenolic resin.

7. The resistor of claim 1, wherein the length of the first trimming groove is set for a length needed to attain a resistance of not less than 80% of a targeted resistance.

8. The resistor of claim 1, wherein the length the second trimming groove is set for a length by which the ratio of resistance correction after the second trimming is not higher than 1.3 times relative to the resistance before the second trimming.

9. The resistor of claim 1, wherein the resistance restoring layer is formed of a borosilicate lead glass having a softening point of 500° C.–600° C.

10. The resistor of claim 1, wherein the protective layer is formed of an epoxy resin or a phenolic resin.

11. The resistor of claim 1, further comprising:

a pair of side electrode layers provided on the side surface of the substrate, which side electrode layer being electrically connected with the upper-surface electrode layer.

12. The resistor of claim 11, wherein the length of the first trimming groove is set for a length needed to attain a resistance of not less than 80% of a targeted resistance.

13. The resistor of claim 11, wherein the length the second trimming groove is set for a length by which the ratio of resistance correction after the second trimming is not higher than 1.3 times relative to the resistance before the second trimming.

14. The resistor of claim 11, wherein the resistance restoring layer is formed of a borosilicate lead glass having a softening point of 500° C.–600° C.

15. The resistor of claim 11, wherein the protective layer is formed of an epoxy resin or a phenolic resin.

16. The resistor of claim 1, wherein said second trimming groove is formed through said resistor layer and said resistance restoring layer.

* * * * *

UNITED STATES PATENT AND TRADEMARK OFFICE

CERTIFICATE OF CORRECTION

PATENT NO. : 6,304,167 B1 
DATED : October 16, 2001
INVENTOR(S) : Nakayama

It is certified that error appears in the above-identified patent and that said Letters Patent is hereby corrected as shown below:

<u>Column 10,</u>
Lines 27, 30, 35 and 38, “2” should read -- 1 --.

Signed and Sealed this

Seventeenth Day of December, 2002

JAMES E. ROGAN
*Director of the United States Patent and Trademark Office*